United States Patent
Andry et al.

(10) Patent No.: US 7,741,722 B2
(45) Date of Patent: Jun. 22, 2010

(54) THROUGH-WAFER VIAS

(75) Inventors: Paul Stephen Andry, Yorktown Heights, NY (US); Edmund Juris Sprogis, Underhill, VT (US); Kenneth Jay Stein, Sandy Hook, CT (US); Timothy Dooling Sullivan, Underhill, VT (US); Cornelia Kang-I Tsang, Mohegan Lake, NY (US); Ping-Chuan Wang, Hopewell Junction, NY (US); Bucknell C. Webb, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 11/690,181

(22) Filed: Mar. 23, 2007

(65) Prior Publication Data
US 2008/0274583 A1  Nov. 6, 2008

(51) Int. Cl.
*H01L 23/48* (2006.01)
(52) U.S. Cl. .............................. 257/774; 257/E23.011; 438/629; 438/637
(58) Field of Classification Search ................. 257/774, 257/E23.011
See application file for complete search history.

(56) References Cited

U.S. PATENT DOCUMENTS 6,013,579 A * 1/2000 Wang et al. ................ 438/692
6,287,960 B1 * 9/2001 Lao ............................. 438/637
6,667,549 B2 12/2003 Cahill
6,960,490 B2 11/2005 Cunningham

FOREIGN PATENT DOCUMENTS

CN            1595633 A      3/2005
WO    WO2007024666 A2      3/2007

* cited by examiner

*Primary Examiner*—Thao X Le
*Assistant Examiner*—Ajay K Arora
(74) *Attorney, Agent, or Firm*—Schmeiser, Olsen & Watts; Richard M. Kotulak (57) ABSTRACT

A through-wafer via structure and method for forming the same. The through-wafer via structure includes a wafer having an opening and a top wafer surface. The top wafer surface defines a first reference direction perpendicular to the top wafer surface. The through-wafer via structure further includes a through-wafer via in the opening. The through-wafer via has a shape of a rectangular plate. A height of the through-wafer via in the first reference direction essentially equals a thickness of the wafer in the first reference direction. A length of the through-wafer via in a second reference direction is at least ten times greater than a width of the through-wafer via in a third reference direction. The first, second, and third reference directions are perpendicular to each other.

28 Claims, 11 Drawing Sheets

THROUGH-WAFER VIAS

FIELD OF THE INVENTION

The present invention relates generally to through-wafer vias and more particularly to the formation of through-wafer vias that have high-aspect ratios.

BACKGROUND OF THE INVENTION

In a conventional semiconductor wafer, there is a need to form through-wafer vias that electrically connect from a top surface of the semiconductor wafer to a bottom surface of the semiconductor wafer (hence the name through-wafer vias). If through-wafer vias have high-aspect ratios (i.e., the heights of through-wafer vias are much greater than their widths), the through-wafer vias are very difficult to form. Therefore, there is a need for a method to form the through-wafer vias that is better than the method of the prior art.

SUMMARY OF THE INVENTION

The present invention provides a structure, comprising (a) a wafer which includes (i) an opening and (ii) a top wafer surface, wherein the top wafer surface defines a first reference direction perpendicular to the top wafer surface; and (b) a through-wafer via in the opening, wherein the through-wafer via has a shape of a rectangular plate, wherein a height of the through-wafer via in the first reference direction essentially equals a thickness of the wafer in the first reference direction, wherein a length of the through-wafer via in a second reference direction is at least ten times greater than a width of the through-wafer via in a third reference direction, wherein said height of the through-wafer via is at least ten times greater than said width of the through-wafer via, wherein the second reference direction and the third reference direction are perpendicular to each other, and wherein the second reference direction and the third reference direction are both perpendicular to the first reference direction.

The present invention provides a method to form through-wafer vias that is better than the method of the prior art.

BRIEF DESCRIPTION OF THE DRAWINGS

FIG. 2A' shows a perspective view of the through-wafer via structure of FIG. 2A, in accordance with embodiments of the present invention.

DETAILED DESCRIPTION OF THE INVENTION

FIGS. 1A-1G show top down views and cross-section views of a semiconductor structure 100 going through different steps of a via fabrication process, in accordance with embodiments of the present invention.

Figure 1:
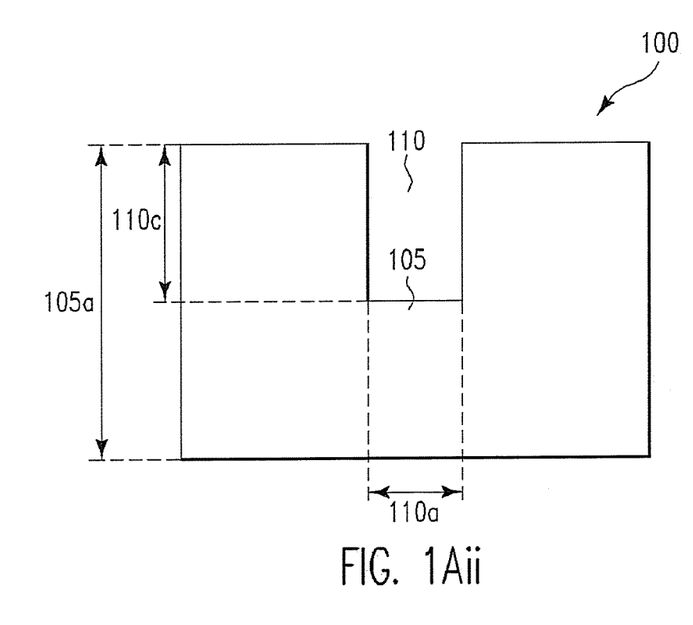
FIGS. 1A-1G show top down views and cross-section views of a semiconductor structure going through different steps of a via fabrication process, in accordance with embodiments of the present invention.
Figure 1A:
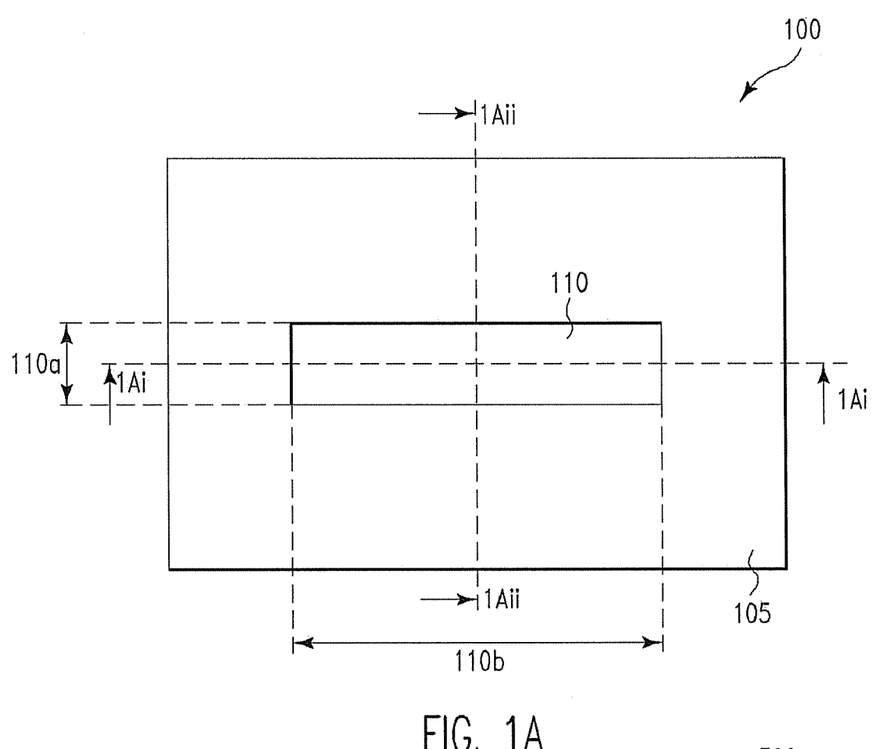

More specifically, with reference to FIG. 1A (top down view), the via fabrication process starts with a semiconductor structure 100 which comprises a silicon wafer 105 and a through-wafer via trench 110 in the silicon wafer 105. The through-wafer via trench 110 can be formed by lithographic and etching processes.

In one embodiment, a length 110b of the through-wafer via trench 110 is much larger (e.g., at least ten times greater) than a width 110a of the through-wafer via trench 110. For example, the width 110a can be 4 μm, whereas the length 110b can be at least 40 μm.

FIG. 1Ai shows a cross section view of the semiconductor structure 100 of FIG. 1A along a first line 1Ai-1Ai, in accordance with embodiments of the present invention. In one embodiment, a depth 110c of the through-wafer via trench 110 is about 180 μm or about one fourth a thickness 105a of the silicon wafer 105.

FIG. 1Aii shows a cross section view of the semiconductor structure 100 of FIG. 1A along a second line 1Aii-1Aii, in accordance with embodiments of the present invention. In one embodiment, the depth 110c of the through-wafer via trench 110 is at least ten times the width 110a of the through-wafer via trench 110.

Next, with reference to FIG. 1Bi, in one embodiment, a dielectric layer 115 is formed on exposed surfaces of the semiconductor structure 100 of FIG. 1Ai. The dielectric layer 115 can comprise silicon dioxide. In one embodiment, the dielectric layer 115 can be formed by CVD (Chemical Vapor Deposition) of silicon dioxide on top of the exposed surfaces of the semiconductor structure 100 of FIG. 1Ai. Alternatively, the dielectric layer 115 can be formed by thermally oxidizing the exposed surfaces of the semiconductor structure 100 of FIG. 1Ai.

FIG. 1Bii shows the semiconductor structure 100 resulting from the formation of the dielectric layer 115 on the exposed surfaces of the semiconductor structure 100 of FIG. 1Aii.

Next, with reference to FIG. 1Ci, in one embodiment, a through-wafer via layer 120 is formed on top of the semiconductor structure 100 of FIG. 1Bi (including in the through-wafer via trench 110). The through-wafer via layer 120 can comprise tungsten. The through-wafer via layer 120 can be formed by CVD of tungsten on top of the semiconductor structure 100 of FIG. 1Bi (including in the through-wafer via trench 110).

FIG. 1Cii shows the semiconductor structure 100 resulting from the formation of the through-wafer via layer 120 on top of the semiconductor structure 100 of FIG. 1Bii (including in the through-wafer via trench 110).

Next, with reference to FIG. 1Ci, in one embodiment, a top portion 120a of the through-wafer via layer 120 outside the through-wafer via trench 110 is removed such that a top surface 115a of the dielectric layer 115 is exposed to the surrounding ambient as shown in FIG. 1Di. What remains of the through-wafer via layer 120 after the removal can be referred to a through-wafer via 120' (FIG. 1Di). The top portion 120a of the through-wafer via layer 120 outside the through-wafer via trench 110 can be removed by chemical mechanical polishing (CMP).

FIG. 1Dii shows the semiconductor structure 100 resulting from the removal of the top portion 120a of the through-wafer via layer 120 of FIG. 1Cii.

Figure 1E:
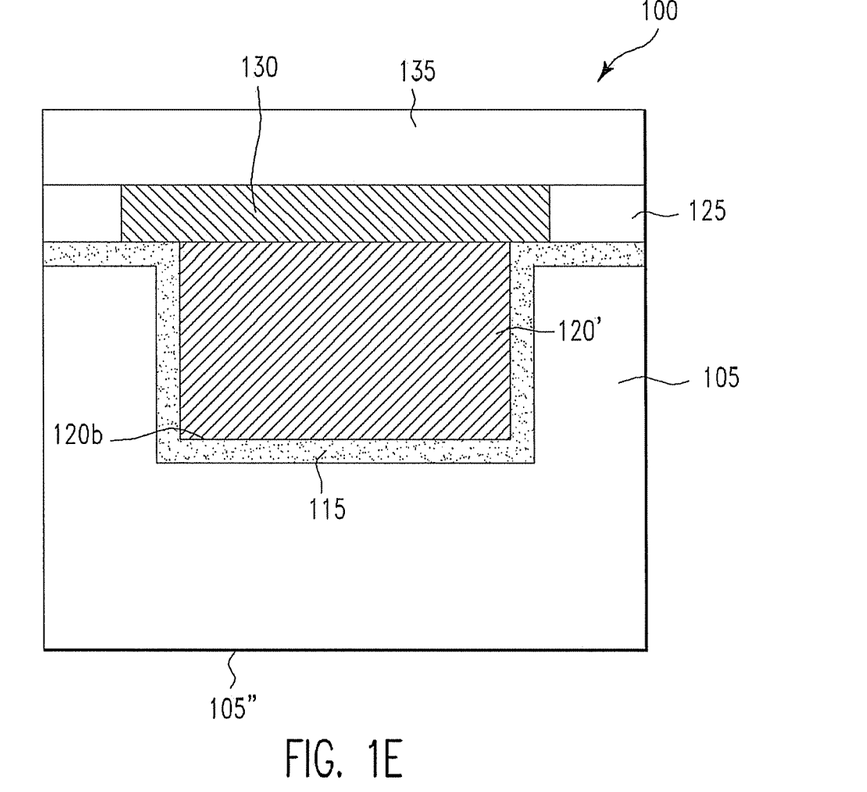

Next, with reference to FIG. 1E, in one embodiment, additional conventional steps are performed on the semiconductor structure 100 of FIG. 1Di resulting in the semiconductor structure 100 of FIG. 1E.

In one embodiment, the semiconductor structure 100 in FIG. 1E comprises the silicon wafer 105, the dielectric layer 115, the through-wafer via 120', an insulating layer 125, atop pad structure 130, and a glass handler 135. The handler 135 can also be made of silicon.

More specifically, the top pad structure 130 can comprise Cu, whereas the dielectric layer 115 can comprise silicon dioxide. The glass handler 135 is attached to the insulating layer 125 and the top pad structure 130 by an adhesive layer (not shown).

Figure 1F:
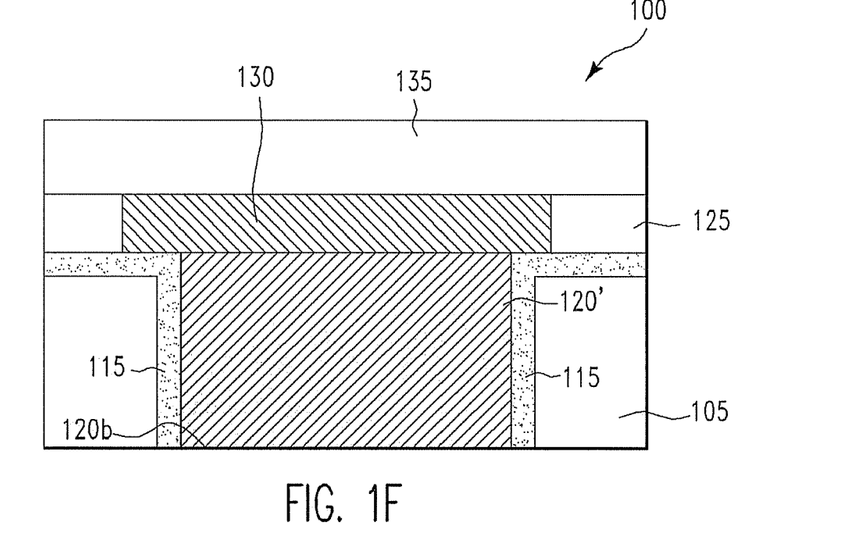

Next, in one embodiment, a bottom surface 105" of the silicon wafer 105 is mechanically ground until a bottom surface 120b of the through-wafer via 120' is exposed to the surrounding ambient resulting in the semiconductor structure 100 of FIG. 1F.

Figure 1G:
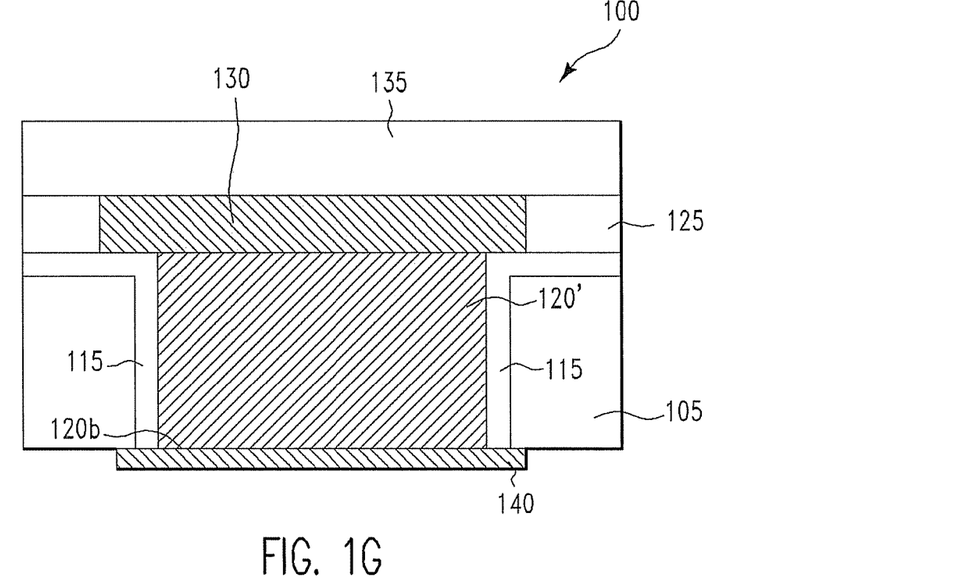

Next, with reference to FIG. 1G, a bottom pad structure 140 is formed on the bottom surface 120b of the through-wafer via 120'. More specifically, the bottom pad structure 140 can comprise Cu. The bottom pad structure 140 can be formed by using lithography and etching processes. As seen in FIG. 1G, the through-wafer via 120' provides an electrical path through a thickness 105b of the wafer 105.

Figure 2A:
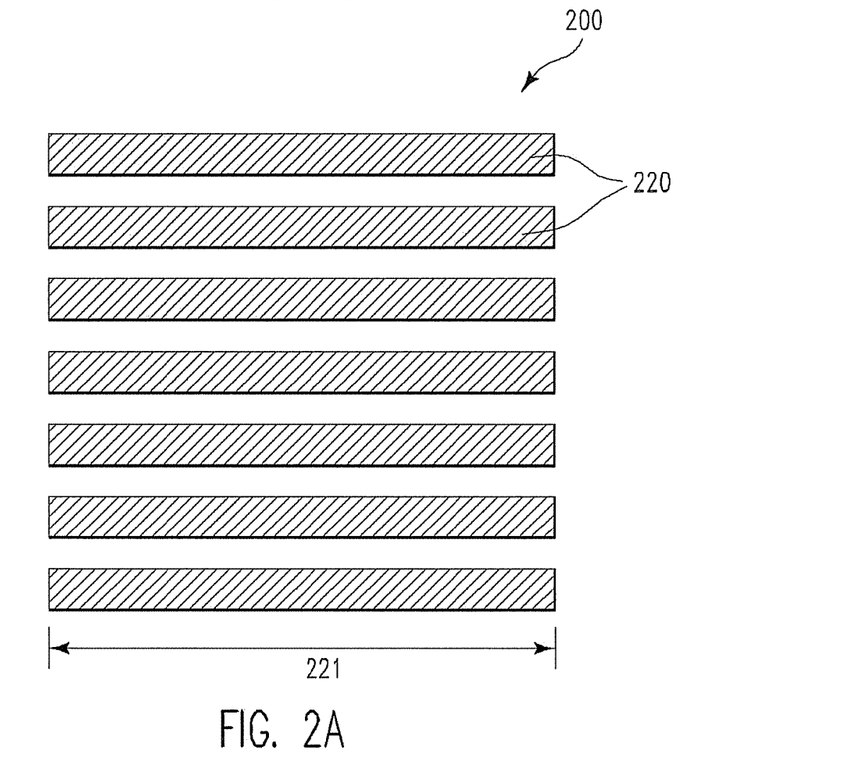
FIG. 2A shows a top down view of a through-wafer via structure, in accordance with embodiments of the present invention.

FIG. 2A shows a top down view of a through-wafer via structure 200 formed in a wafer (not shown) in accordance with embodiments of the present invention. More specifically, the through-wafer via structure 200 can comprise multiple through-wafer vias 220 (seven are shown for illustration) each of which is similar to the through-wafer via 120' of FIG. 1G, to form the composite through-wafer via structure 200.

Each of the multiple through-wafer vias 220 of the composite through-wafer via structure 200 can be formed in a manner similar to the manner in which the through-wafer via 120' (of FIG. 1G) is formed. In one embodiment, the multiple through-wafer vias 220 are formed simultaneously.

It should be noted that each of the multiple through-wafer vias 220 comprises other layers (not shown) similar to the silicon wafer 105, the dielectric layer 115, the insulating layer 125, and the glass handler 135 of FIG. 1G. However these layers are not shown in FIG. 2A for simplicity. In one embodiment, the multiple through-wafer vias 220 have a same length 221.

FIG. 2A' shows a perspective view of the composite through-wafer via structure 200 of FIG. 2A, in accordance with embodiments of the present invention. It should be noted that a top pad structure 230 and a bottom pad structure 240 are respectively similar to the top pad structure 130 and the bottom pad structure 140 of FIG. 1G. More specifically, all the multiple through-wafer vias 220 are electrically coupled to the top pad structure 230 and the bottom pad structure 240.

Figure 2B:
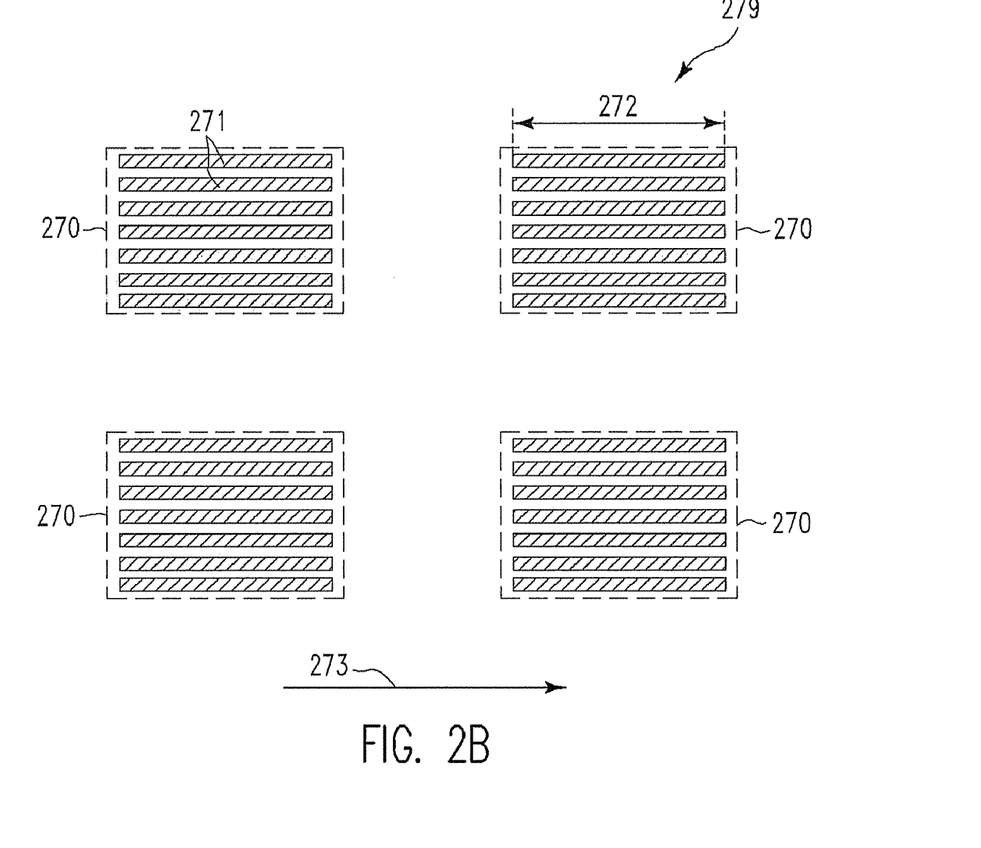
FIG. 2B shows a top down view of a through-wafer via system, in accordance with embodiments of the present invention.

FIG. 2B illustrates a top down view of a through-wafer via system 279, in accordance with embodiments of the present invention. More specifically, the through-wafer via system 279 comprises four composite through-wafer via structures 270. Each of the four composite through-wafer via structures 270 can comprise seven through-wafer vias 271.

In one embodiment, each of the four composite through-wafer via structures 270 is similar to the through-wafer via structure 200 of FIG. 2A. It should be noted that, the top pad structure 230, the bottom pad structure 240, and other layers of the four composite through-wafer via structures 270 are not shown in FIG. 2B for simplicity.

For each of the four composite through-wafer via structures 270, the seven through-wafer vias 271 can be formed simultaneously. Each of the four composite through-wafer via structures 270 can be formed in a manner similar to the manner in which the through-wafer via structure 200 of FIG. 2A is formed. In one embodiment, all the 28 through-wafer vias 271 of the through-wafer via system 279 have the same length 272. All the 28 through-wafer vias 271 of the through-wafer via system 279 can run in the same direction 273. The four composite through-wafer via structures 270 can be arranged in an array of 2 rows and 2 columns as shown.

Figure 2C:
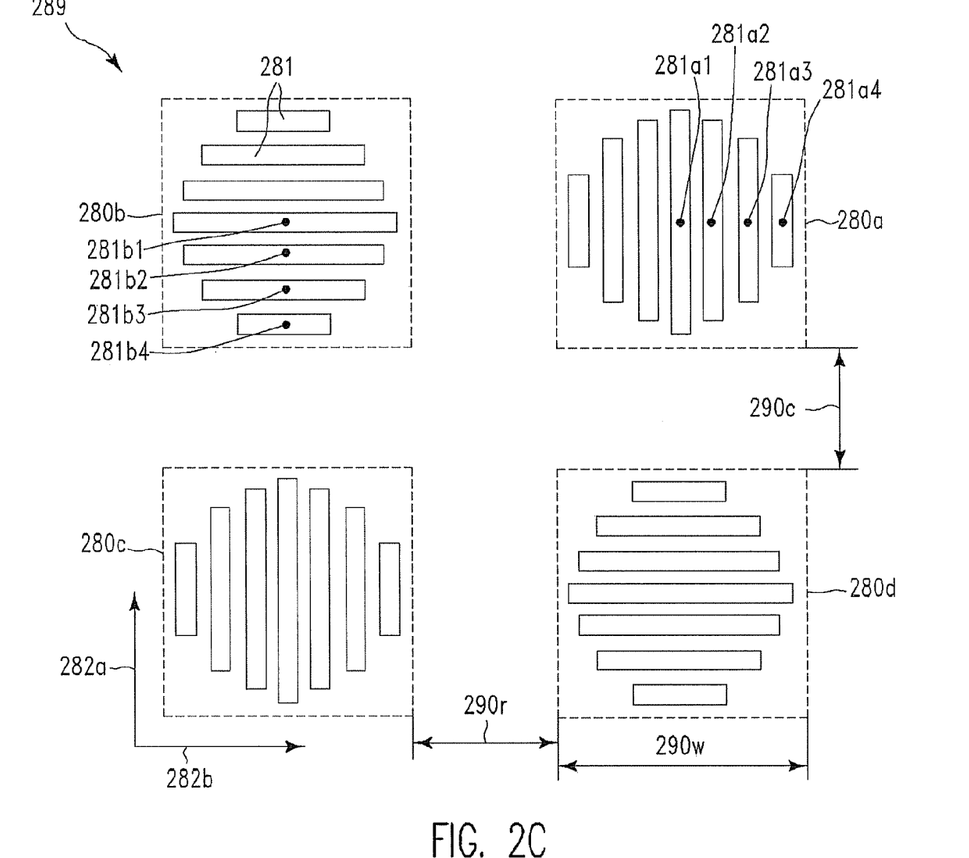
FIG. 2C shows a top down view of a through-wafer via system of FIG. 2B, in accordance with embodiments of the present invention.

FIG. 2C shows a top down view of a through-wafer via system 289 in accordance with embodiments of the present invention. More specifically, the through-wafer via system 289 can comprise four composite through-wafer via structures 280a, 280b, 280c, and 280d. Each of the four composite through-wafer via structures 280a, 280b, 280c, and 280d can comprise seven through-wafer vias 281.

In one embodiment, each of the four composite through-wafer via structures 280a, 280b, 280c, and 280d is similar to the composite through-wafer via structure 200 of FIG. 2A'. It should be noted that, the top pad structure 230, the bottom pad structure 240, and other layers of the four composite through-wafer via structures 280a, 280b, 280c, and 280d are not shown in FIG. 2C for simplicity.

For each of the four composite through-wafer via structures 280a, 280b, 280c, and 280d, the seven through-wafer vias 281 can be formed simultaneously in a wafer (not shown). Each of the four through-wafer via structures 280a, 280b, 280c, and 280d can be formed in a manner similar to the manner in which the composite through-wafer via structure 200 of FIG. 2A is formed except that for each of the four through-wafer via structures 280a, 280b, 280c, and 280d, the lengths of the seven through-wafer vias 281 are not the same.

More specifically, for each of the four composite through-wafer via structures 280a, 280b, 280c, and 280d, when going from the center to the outside of the structure, the lengths of the seven through-wafer vias 281 become shorter and shorter.

For example, in the composite through-wafer via structure 280a, the length of a first through-wafer via 281a1 is greater than the length of a second through-wafer via 281a2, which is in turn greater than the length of a third through-wafer via 281a3, which is in turn greater than the length of a fourth through-wafer via 281a4.

For another example, the length of a first through-wafer via 281b1 is greater than the length of a second through-wafer via 281b2, which is in turn greater than the length of a third through-wafer via 281b3, which is in turn greater than the length of a fourth through-wafer via 281b4.

With reference to FIG. 2C, in one embodiment, the four composite through-wafer via structures 280a, 280b, 280c, and 280d are arranged in a manner similar to the manner in which the four composite through-wafer via structures 270 of FIG. 2B are arranged (i.e., in an array of 2 rows and 2 columns) except that when going from one structure to the next structure in the same row or the same column, the orientation of the seven through-wafer vias 281 changes 90 degrees.

For example, the seven through-wafer vias 281 of the composite through-wafer via structure 280a run in a direction 282a, whereas the seven through-wafer vias 281 of the composite through-wafer via structure 280b run in a direction 282b which is perpendicular to the direction 282a. In other words, when going from the composite through-wafer via structure 280a to composite through-wafer via structure 280b in a same row, the direction of the seven through-wafer vias 281 changes from the direction 282a to the direction 282b (i.e., changing 90 degrees).

For another example, the seven through-wafer vias 281 of the composite through-wafer via structure 280a run in the direction 282a, whereas the seven through-wafer vias 281 of the composite through-wafer via structure 280d run in the direction 282b which is perpendicular to the direction 282a. In other words, when going from the composite through-wafer via structure 280a to the composite through-wafer via structure 280d in a same column, the direction of the seven through-wafer vias 281 changes from the direction 282a to the direction 282b (i.e., changing 90 degrees).

Figure 3A:
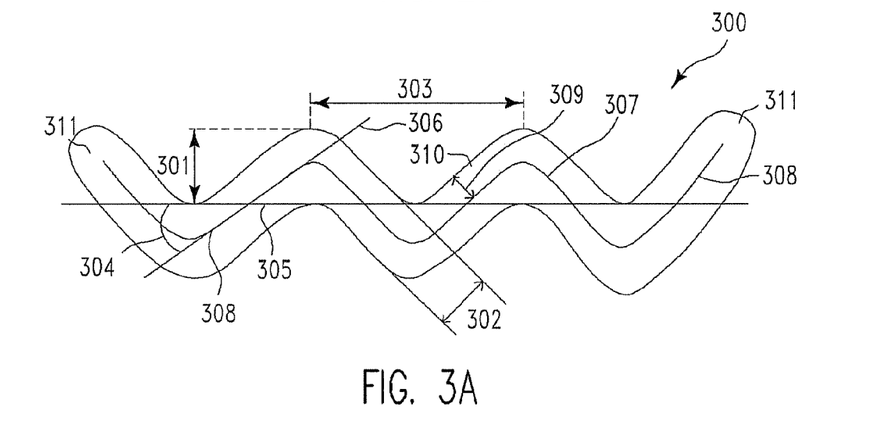
FIG. 3A shows a top down view of another through-wafer via, in accordance with embodiments of the present invention.

FIG. 3A shows a top down view of a through-wafer via 300 in accordance with embodiments of the present invention. More specifically, the through-wafer via 300 has a sinusoidal shape. In one embodiment, the through-wafer via structure 300 has a wave length 303 of about 12 μm, a width 301 of about 4 μm, and a thickness 302 of about 3 μm. In one embodiment, an angle 304 formed by a centerline 305 and a segment axis 306 is about 45°. In one embodiment, the ends 311 of the through-wafer via 300 are rounded.

Assume that a trench is formed in place of the through-wafer via 300 (i.e., the trench has a same size, shape and location as the through-wafer via 300). Assume further that the trench is being filled with a filling material using CVD. As the result, the filling material grows from the side walls of the trench and converges to a convergence surface 307 in the trench. A plane parallel to a top surface of the semiconductor wafer would intersect the convergence surface 307 through a convergence curve 308. A length of the convergence curve 308 can be considered the length of the through-wafer via 300. A convergence distance 309 is the distance by which the filling material grows from a side wall 310 of the trench to the convergence surface 307. In one embodiment, the length of the through-wafer via 300 is at least twenty times greater than the convergence distance 309.

Figure 3B:
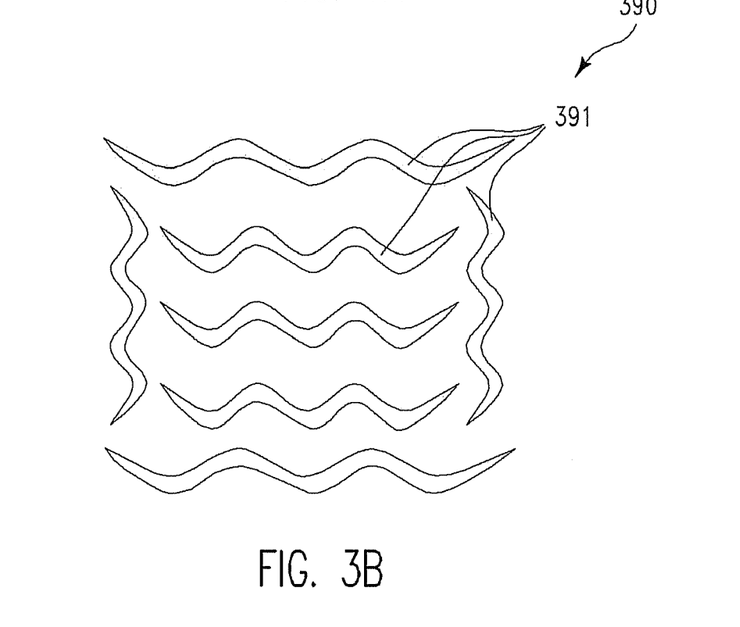
FIG. 3B illustrates a top down view of a through-wafer via structure utilizing the through-wafer via of FIG. 3A, in accordance with embodiments of the present invention.

FIG. 3B illustrates a top down view of a composite through-wafer via structure 390, in accordance with embodiments of the present invention. The composite through-wafer via structure 390 can be formed in a wafer (not shown). More specifically, the through-wafer via structure 390 can comprise multiple (seven shown here for illustration) through-wafer vias 391. Each of the seven through-wafer vias 391 is similar to the through-wafer via 300 of FIG. 3A. In one embodiment, the composite through-wafer via structure 390 has the shape of a rectangle. More specifically, four of the seven through-wafer vias 391 are at the four sides of the rectangle, the other three through-wafer vias 391 are arranged inside of the rectangle.

In summary, with reference to FIG. 1A, the length 110b of the through-wafer via trench 110 is much greater than the width 110a of the through-wafer via trench 110. As a result, although the depth 110c (FIG. 1Aii) of the through-wafer via trench 110 is much greater than the width 110a of the through-wafer via trench 110 (high-aspect ratio), the through-wafer via trench 110 can be filled with a metal (preferably tungsten) with high quality due to the length 110b being much greater than the width 110a.

In the embodiments above, with reference to FIG. 2B, the number of through-wafer vias 271 in each composite through-wafer via structures 270 is seven. In general, the through-wafer via structures 270 can have different numbers of through-wafer vias 271. For example, a first through-wafer via structure 270 can have 5 through-wafer vias 271, a second through-wafer via structure 270 can have 6 through-wafer vias 271, a third through-wafer via structure 270 can have 7 through-wafer vias 271, and a fourth through-wafer via structure 270 can have 8 through-wafer vias 271.

It should be noted that the present invention may also be applied to thin wafers and to wafers of any material (such as glass, metal, and ceramic) for which a suitable etching process can be found.

Figure 4:
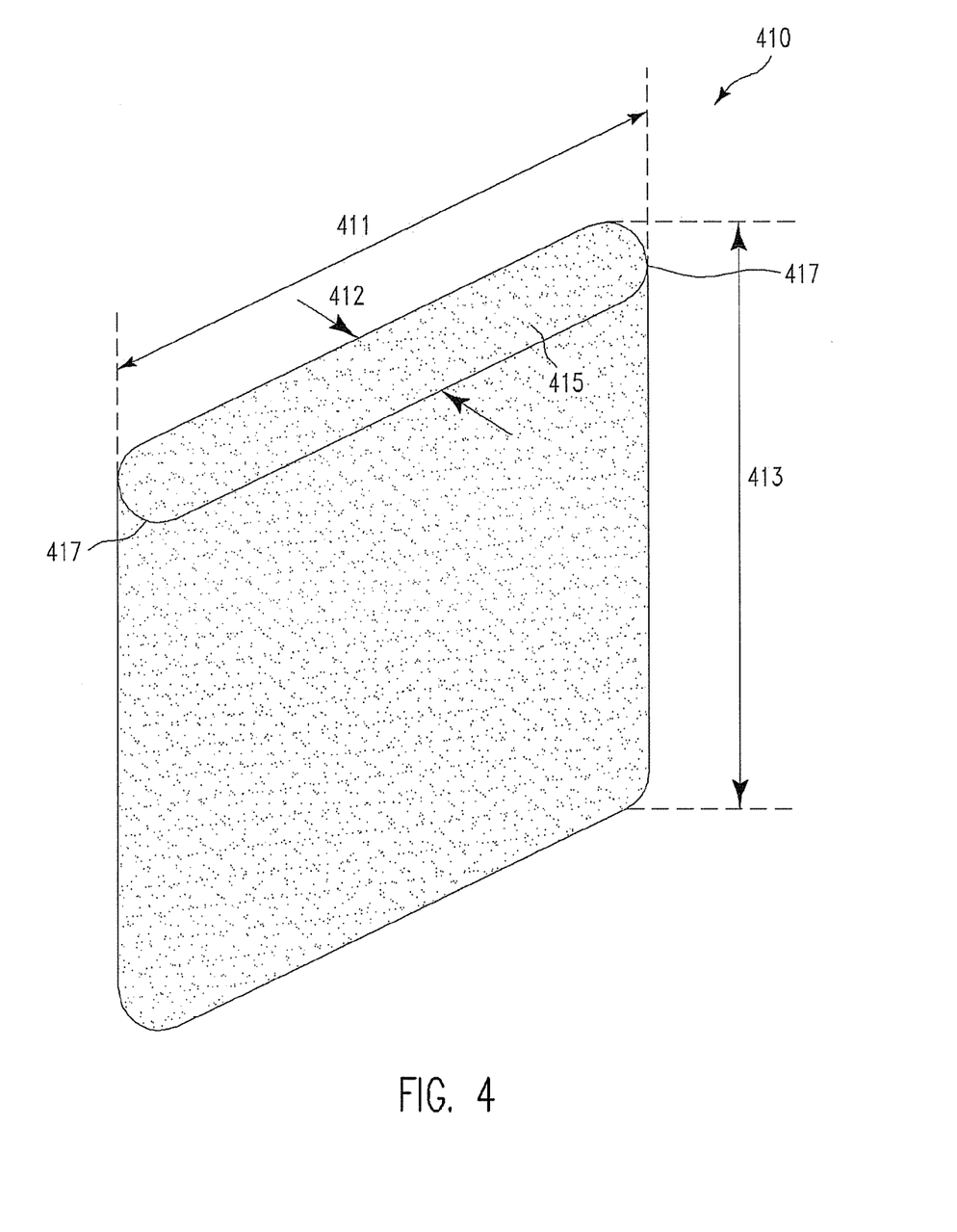
FIG. 4 shows a perspective view of a through-wafer via 410, in accordance with embodiments of the present invention.

FIG. 4 shows a perspective view of a through-wafer via 410, in accordance with embodiments of the present invention. The through-wafer via 410 is similar to the through-wafer via 120' of FIG. 1G (i.e., having a shape of a rectangular plate) except that the vertical edges 417 of the through-wafer via 410 are rounded. Similar to the through-wafer via 120' of FIG. 1G, the through-wafer via 410 has its length 411 being much greater (e.g., at least 10 times greater) than its width 412.

Figure 5:
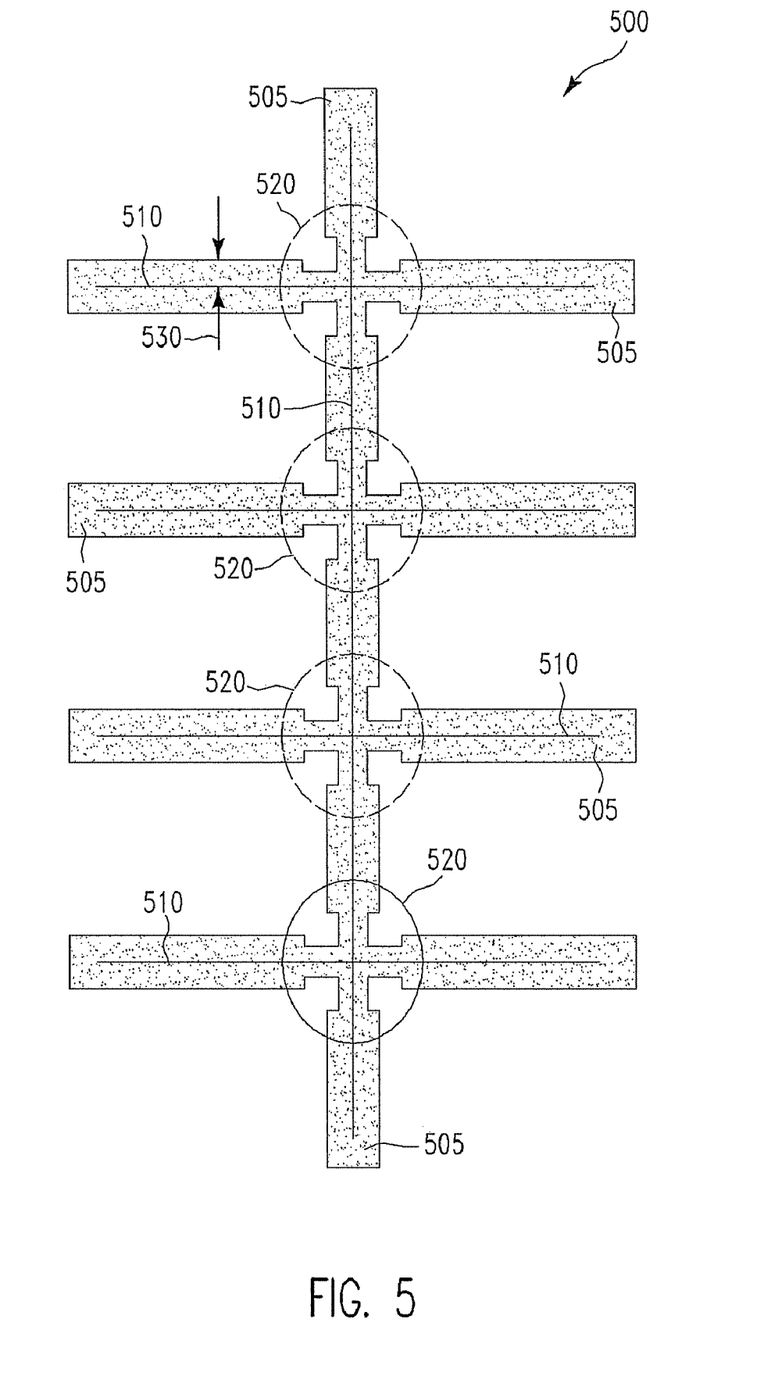
FIG. 5 shows a top-down view of a through-wafer via 500, in accordance with embodiments of the present invention.

FIG. 5 shows a top-down view of a through-wafer via 500, in accordance with embodiments of the present invention. The through-wafer via 500 can have multiple branches 505 and multiple intersections 520. Although the intersections 520 are all 4-way in FIG. 5, in general the intersections of the through-wafer via 500 can be N-way (N is an integer greater than 2).

Assume that a trench is formed in place of the through-wafer via 500 (i.e., the trench has a same size, shape and location as the through-wafer via 500). Assume further that the trench is being filled with a filling material using CVD. As the result, the filling material grows from the side walls of the trench and converges to a convergence surface 510 in the trench. A plane parallel to a top surface of the semiconductor wafer would intersect the convergence surface 510 through a convergence curve (which coincides with the convergence surface 510 due to the top down view. Therefore, the same numeral 510 can be used for both). Because the through-wafer via 500 has multiple branches 505 and multiple intersections 520, the convergence curve 510 also has multiple branches and multiple intersections. In one embodiment, the total length of the convergence curve 510 is at least twenty times a convergence distance 530.

It should be noted that there is no closed loop in the convergence curve 510. Also, in one embodiment, the intersections 520 of the through-wafer via 500 are tailored such that the intersections 520 can be filled by a CVD process.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure, comprising:
(a) a wafer which includes (i) N openings and (ii) a top wafer surface,
   wherein N is an odd integer of at least 7, and
   wherein the top wafer surface defines a first reference direction perpendicular to the top wafer surface; and
(b) N through-wafer vias in the N openings,
   wherein each through-wafer via of the N through-wafer vias has a shape of a rectangular plate,
   wherein the N through-wafer vias are parallel to one another,
   wherein a height in the first reference direction of each through-wafer via of the N through-wafer vias is equal to a thickness of the wafer, wherein a length in a second reference direction of each through-wafer via of the N through-wafer vias is at least ten times greater than a width in a third reference direction of the each through-wafer via, wherein said height of the each through-wafer via is at least ten times greater than said width of the each through-wafer via, wherein the second reference direction and the third reference direction are perpendicular to each other, wherein the second reference direction and the third reference direction are both perpendicular to the first reference direction, wherein the N through-wafer vias are, in an ordered spatial sequence, denoted as V(1), V(2), ... V(N), and wherein if V(I) is closer to V(M) than is V(J) in the third reference direction, then the length of V(I) is greater than the length of V(J) in the second reference direction for I=1, 2, ... N and J=1, 2, ... N subject to M=(N+1)/2, I≠M, J≠M, and I≠J.

2. The structure of claim 1, further comprising a top pad structure which is in direct physical contact with all the N through-wafer was.

3. The structure of claim 2, wherein the top pad structure comprises a material selected from the group consisting of copper and aluminum.

4. The structure of claim 3, further comprising a bottom pad structure,
wherein the bottom pad structure is in direct physical contact with all the N through-wafer vias,
wherein the N through-wafer vias are disposed between the top pad structure and the bottom pad structure,
wherein the N through-wafer vias are perpendicular to the top pad structure and the bottom pad structure, and
wherein the bottom pad structure comprises a material selected from the group consisting of copper and aluminum.

5. The structure of claim 1, further comprising a dielectric layer which is (i) sandwiched between and (ii) in direct physical and electrical contact with the wafer and the N through-wafer vias.

6. A structure, comprising:
(a) a wafer which includes a top wafer surface,
wherein the top wafer surface defines a first direction perpendicular to the top wafer surface; and
(b) M composite through-wafer via structures,
wherein M is an integer greater than one,
wherein the M composite through-wafer via structures are arranged in an array of C columns and R rows such that C is at least 1 and R is at least 1,
wherein for i=1, ..., M, an ith composite through-wafer via structure of the M composite through-wafer via structures comprises $N_i$ through-wafer vias in the wafer, each through-wafer via of the $N_i$ through-wafer vias having a shape of a rectangular plate,
wherein $N_i$ is an integer greater than one,
wherein the $N_i$ through-wafer vias are parallel to one another,
wherein in the $i^{th}$ composite through-wafer via structure, a height of each through-wafer via of the $N_i$ through-wafer vias in the first direction is equal to a thickness of the wafer in the first direction,
wherein the first direction, a second direction, and a third direction are fixed directions that are mutually perpendicular to each other, and
wherein the $N_1$ through-wafer vias of the first composite through-wafer via structure are spaced apart from each other in the second direction, and wherein the $N_2$ through-wafer vias of the second composite through-wafer via structure are spaced apart from each other in the third direction.

7. The structure of claim 6,
wherein a distance Dc between 2 adjacent composite through-wafer via structure of the M composite through-wafer via structures in a same column is greater than a width of the M composite through-wafer via structures, and
wherein a distance Dr between 2 adjacent composite through-wafer via structure of the M composite through-wafer via structures in a same row is greater than the width of the M composite through-wafer via structures.

8. The structure of claim 6, wherein all the through-wafer vias of the M composite through-wafer via structures are parallel to one another.

9. The structure of claim 8, wherein all the through-wafer vias of the M composite through-wafer via structures have a same length in the second direction.

10. The structure of claim 6, wherein all the through-wafer vias of the M composite through-wafer via structures do not have the same length in the second direction.

11. The structure of claim 10, wherein for i=1, ..., M, in the $i^{th}$ composite through-wafer via structure, if a first through-wafer via of the $N_i$ through-wafer vias is closer to a center of the $i^{th}$ composite through-wafer via structure than a second through-wafer via of the $N_i$ through-wafer vias, then a first length of the first through-wafer via in a reference direction is greater than a second length of the second through-wafer via in the reference direction.

12. The structure of claim 6,
wherein a first direction of the $N_1$ through-wafer vias of the first composite through-wafer via structure is perpendicular to a second direction of the $N_2$ through-wafer vias of the second composite through-wafer via structure, and
wherein the first composite through-wafer via structure and the second composite through-wafer via structure are in a same row of the array.

13. The structure of claim 12,
wherein a third direction of the $N_3$ through-wafer vias of the third composite through-wafer via structure is perpendicular to the first direction, and
wherein the third composite through-wafer via structure and the first composite through-wafer via structure are in a same column of the array.

14. The structure of claim 6, wherein C is at least 2, and wherein R is at least 2.

15. The structure of claim 6, wherein C is at least 2.

16. The structure of claim 15, wherein the first composite through-wafer via structure is in row 1 of the R rows and column 1 of the C columns, and wherein the second composite though-wafer via structure is in row 1 of the R rows and column 2 of the C columns.

17. The structure of claim 16, wherein R is at least 2.

18. The structure of claim 17, wherein the $N_3$ through-wafer vias of the third composite through-wafer via structure are spaced apart from each other in the third reference direction, and wherein the third composite through-wafer via structure is in row 2 of the R rows and column 1 of the C columns.

19. The structure of claim 18, wherein the $N_4$ through-wafer vias of the fourth composite through-wafer via structure are spaced apart from each other in the second reference direction, and wherein the fourth composite through-wafer via structure is in row 2 of the R rows and column 2 of the C columns.

20. A structure, comprising:
(a) a wafer which includes (i) an opening and (ii) a top wafer surface,
   wherein the top wafer surface defines a first reference direction perpendicular to the top wafer surface; and
(b) a trench filled with a filling material,
   wherein the filling material extends from side walls of the trench and converges onto a convergence surface,
   wherein a plane perpendicular to the first reference direction intersects the convergence surface through a convergence curve,
   wherein the convergence curve does not comprise a closed loop,
   wherein a height of the trench in the first reference direction essentially equals a thickness of the wafer in the first reference direction,
   wherein a length of the convergence curve is at least twenty times greater than a convergence distance by which the filling material grows from the side walls of the trench to the convergence surface, and
   wherein said height of the trench is at least 20 times the convergence distance.

21. The structure of claim 20, wherein the convergence curve has at least an N-way intersection, N being an integer greater than 2.

22. The structure of claim 20, wherein the convergence curve has a sinusoidal shape.

23. The structure of claim 22, wherein the sinusoidal shape has a wave length of about 12 μm.

24. The structure of claim 20, further comprising a dielectric layer which is (i) sandwiched between, and (ii) in direct physical contact with the trench and the wafer.

25. The structure of claim 20, further comprising a top pad structure which is (i) on top of the trench and (ii) in direct physical contact with the trench and the dielectric layer.

26. The structure of claim 25, wherein the top pad structure comprises a material selected from the group consisting of copper and aluminum.

27. The structure of claim 26, further comprising a bottom pad structure which is (i) at the bottom of the trench and (ii) in direct physical and electrical contact with the trench and the wafer.

28. The structure of claim 27, wherein the trench is disposed between the top pad structure and the bottom pad structure.

* * * * *